US008890092B2

(12) United States Patent
Kim et al.

(10) Patent No.: US 8,890,092 B2
(45) Date of Patent: Nov. 18, 2014

(54) MULTI-PARTICLE BEAM COLUMN HAVING AN ELECTRODE LAYER INCLUDING AN ECCENTRIC APERTURE

(71) Applicants: Ho Seob Kim, Incheon (KR); Dae Wook Kim, Seongnam-si (KR); Seung Jun Ahn, Daejeon (KR); Tae Sik Oh, Cheonam-si (KR)

(72) Inventors: Ho Seob Kim, Incheon (KR); Dae Wook Kim, Seongnam-si (KR); Seung Jun Ahn, Daejeon (KR); Tae Sik Oh, Cheonam-si (KR)

(73) Assignee: Industry—University Cooperation Foundation Sunmoon University, Tangjeon-myeon, Asan-si, Chungcheongnam-do (KR)

( * ) Notice: Subject to any disclaimer, the term of this patent is extended or adjusted under 35 U.S.C. 154(b) by 0 days.

(21) Appl. No.: 13/752,040

(22) Filed: Jan. 28, 2013

(65) Prior Publication Data

US 2014/0209813 A1 Jul. 31, 2014

(51) Int. Cl.
*G21K 5/00* (2006.01)
*G21K 1/08* (2006.01)
*G21K 5/04* (2006.01)

(52) U.S. Cl.
CPC ... *G21K 1/08* (2013.01); *G21K 5/04* (2013.01)
USPC ................ 250/492.1; 250/492.3; 250/492.23

(58) Field of Classification Search
None
See application file for complete search history.

(56) References Cited

U.S. PATENT DOCUMENTS

| 4,209,698 | A  | * | 6/1980  | Hoppe .......................... 250/311 |
| 4,804,851 | A  | * | 2/1989  | Nixon ......................... 250/492.2 |
| 5,006,795 | A  | * | 4/1991  | Yoshizawa et al. ...... 324/754.22 |
| 5,723,938 | A  | * | 3/1998  | Kato et al. ..................... 313/412 |
| 6,703,624 | B2 | * | 3/2004  | Hamaguchi et al. ........ 250/492.2 |
| 6,872,950 | B2 | * | 3/2005  | Shimada et al. ........... 250/396 R |
| 8,148,702 | B2 | * | 4/2012  | Doering et al. ........... 250/492.22 |
| 2001/0028038 | A1 | * | 10/2001 | Hamaguchi et al. ... 250/396 ML |
| 2001/0028043 | A1 | * | 10/2001 | Hamaguchi et al. ....... 250/492.3 |
| 2001/0028044 | A1 | * | 10/2001 | Hamaguchi et al. ....... 250/492.3 |
| 2003/0189180 | A1 | * | 10/2003 | Hamaguchi et al. ....... 250/492.3 |
| 2005/0006604 | A1 | * | 1/2005  | Okubo ..................... 250/492.23 |
| 2006/0289781 | A1 | * | 12/2006 | Tanimoto et al. ......... 250/396 R |
| 2008/0023643 | A1 | * | 1/2008  | Kruit et al. ................. 250/396 R |
| 2008/0315090 | A1 | * | 12/2008 | Nakasuji et al. .............. 250/306 |
| 2009/0289195 | A1 | * | 11/2009 | Henstra ..................... 250/396 R |
| 2011/0084220 | A1 | * | 4/2011  | Koning et al. ............. 250/492.3 |
| 2011/0163244 | A1 | * | 7/2011  | Kruit et al. ................ 250/396 R |
| 2011/0168910 | A1 | * | 7/2011  | Kruit et al. ................ 250/396 R |
| 2011/0216299 | A1 | * | 9/2011  | Steenbrink et al. ............. 355/67 |
| 2011/0284763 | A1 | * | 11/2011 | Henstra ..................... 250/396 R |
| 2012/0241641 | A1 | * | 9/2012  | Sano et al. ................ 250/396 R |
| 2012/0295202 | A1 | * | 11/2012 | Sano ............................. 430/296 |
| 2012/0295203 | A1 | * | 11/2012 | Sano ............................. 430/296 |

FOREIGN PATENT DOCUMENTS

JP 2009-507352 2/2009
KR 10-2006-049861 5/2006

* cited by examiner

*Primary Examiner* — Andrew Smyth
(74) *Attorney, Agent, or Firm* — John K. Park; Park Law Firm

(57) ABSTRACT

Disclosed herein is a multi-particle beam column including electrode layer with eccentric apertures. The multi-particle beam column includes two or more particle beam columns each comprising a particle beam emission source, a deflector, and two or more electrode layers. The multi-particle beam column includes at least one electrode layer having one or more apertures that are eccentric from respective beam optical axes of the particle beam columns.

4 Claims, 5 Drawing Sheets

MULTI-PARTICLE BEAM COLUMN HAVING AN ELECTRODE LAYER INCLUDING AN ECCENTRIC APERTURE

BACKGROUND OF THE INVENTION

1. Field of the Invention

The present invention relates generally to a method of controlling particle beams in a multi-particle beam column and, more particularly, to a multi-particle beam column that is provided with an electrode layer having eccentric apertures, thereby being able to easily control particle beams.

2. Description of the Related Art

Particle beam columns include a particle source (emission source) and electron lenses configured to be operated by an electrostatic field or a magnetic field, and generate, focus, and scan a particle beam, such as an electron beam or an ion beam. Representative particle beam columns are electronic columns using an electron beam, and ion beam columns using an ion beam. Such particle beam columns are used in electron microscopes, semiconductor lithography, and various inspection apparatuses, such as apparatuses for inspecting the via/contact holes of semiconductor devices, apparatuses for inspecting and analyzing the surfaces of samples, or apparatuses for inspecting the wiring of the Thin Film Transistors (TFTs) of display devices such as a TFT-Liquid Crystal Display (LCD) and an Organic Light Emitting Diode (OLED) display, which use an electron beam.

The electron beam column is a representative example of a particle beam column. A microcolumn, which is an example of an electronic column for generating, focusing and scanning an electron beam, is fabricated based on an electron emission source configured to emit electrons and minute electron optical parts configured such that the diameters of apertures through which electrons pass are equal to or smaller than sub-500 micrometers, and was first introduced in the 1980s. A microcolumn enables optical aberration to be minimized by allowing minute parts to be elaborately assembled together, thus forming an improved electron column. A plurality of small structures is arranged, and can be then used in a multi-type electron column structure having a parallel or series structure. For this purpose, a lens is formed of a silicon wafer using a semiconductor manufacturing process. The aperture of the lens is fabricated in the form of a membrane using a process of manufacturing a microelectronicmechanical system (MEMS), and the fabricated lens is used as an electrostatic lens.

FIG. 1 is a diagram showing the structure of a microcolumn, and indicates that an electron emission source, a source lens, a deflector, and an Einzel lens are arranged, and scan an electron beam.

In general, a microcolumn, which is a representative very small-sized electron column, includes an electron emission source 110 configured to emit electrons, indicated by arrows in FIG. 1, a source lens 120 formed of three electrode layers in order to emit, accelerate and control the electrons and configured to form an effective electron beam using the emitted electrons, a deflector 150 configured to deflect the electron beam, and a focusing lens (Einzel lens) 140 configured to focus the electron beam on a sample s. In general, the deflector 150 is located between the source lens 120 and the Einzel lens 140. In order to operate the microcolumn in a normal manner, a negative voltage (about −100 V to −2 kV) is applied to the electron emission source 110, and the electrode layers of the source lens 120 are generally grounded. The Einzel lens 140, which is an example of a focusing lens, is used to focus the electron beam by grounding upper and lower electrode layers and applying a negative (−) voltage (in deceleration mode) or applying a positive (+) voltage (in acceleration mode) to a center electrode layer. Based on the same operation distance, the magnitude of the focusing voltage in deceleration mode is lower than that in acceleration mode. Synchronized deflecting voltage is applied to the deflector 150 in order to adjust the path of the electron beam and scan the electron beam onto the surface of the sample s at regular cycles. An electron lens, such as the above-described source lens or focusing lens, includes two or more electrode layers each including an aperture having a circular or predetermined shape at the center thereof so as to allow an electron beam to pass therethrough, and controls the electron beam. It is commonly formed of three electrode layers.

Microcolumns are classified into single-type microcolumns each including a single electron emission source and electron lenses configured to control an electron beam generated by the electron emission source, and multi-type microcolumns each including a plurality of electron emission sources and electron lenses configured to control a plurality of electron beams emitted by the plurality of electron emission sources. The multi-type microcolumns may be classified into wafer-type microcolumns each including a particle beam emission source configured such that a plurality of electron emission source tips is provided in a single layer, such as a semiconductor wafer, and an electron lens configured such that lens layers, in each of which a plurality of apertures is formed, are stacked on each other, combination-type microcolumns each configured to control electron beams, emitted by respective electron emission sources like a single electron column, using a lens layer having a plurality of apertures, and array-type columns each configured such that single electron columns are mounted and used in a single housing. In the case of a combination-type column, electron emission sources are separate, but lenses are used in the same manner as those of the wafer-type column.

The above particle beam column focuses a particle beam generated by a particle emission source and scans the particle beam onto a sample. Depending on the sample, the case of detecting and utilizing ions or electrons using a sample current method is employed. The sample current method that is capable of directly detecting and checking ions or electrons scanned directly onto a sample from the outside because a conductor part of the sample is connected to the outside may be used to inspect the via/contact holes of semiconductor devices, to inspect and analyze the surfaces of samples, and to inspect the wiring of the TFTs of display devices such as an TFT-LCD and an OLED display. However, when the particle beam column is used to conduct the above inspections or to function as a microscope, and is utilized in the form of a multi-particle beam column so as to improve throughput related to processing speed and the like, there arises a problem in that the multi beam column cannot be easily controlled.

SUMMARY OF THE INVENTION

Accordingly, the present invention has been made keeping in mind the above problems occurring in the prior art, and an object of the present invention is to provide a multi-particle beam column that is capable of easily controlling scanning using an electrode layer having one or more eccentric apertures.

In order to accomplish the above object, the present invention provides a multi-particle beam column, including two or more particle beam columns each comprising a particle beam emission source, a deflector, and two or more electrode layers; wherein the multi-particle beam column comprises at least one electrode layer having one or more apertures that are eccentric from respective beam optical axes of the particle beam columns (hereinafter referred to as the "eccentric electrode layer).

The apertures of the eccentric electrode layer may be arranged to be differently eccentric from the beam optical axes so as to avoid overlapping, and scanning of the respective particle beams of the multi-particle beam column is controlled in an identical manner so that the particle beams scanned by the respective particle beam columns of the multi-particle beam column are not simultaneously scanned onto a sample.

The eccentric electrode layer may be positioned below the deflector.

The multi-particle beam column may comprise two or more eccentric electrode layers, which constitute an electron lens.

The electron lens having two or more eccentric electrode layers may function as a focus lens (Einzel lens).

The eccentric electrode layer may be positioned as the last electrode layer on paths along which beams propagate.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE EMBODIMENTS

In the present invention, an eccentric electrode layer is introduced into a multi-particle beam column including two or more beam columns, and a particle beam is scanned using the same type of deflector in the same direction and at the same voltage, thereby enabling a multi column to be applied to a wide sample using a detection method such as a sample current method. In particular, in this case, if the multi column and/or sample can be moved using a stage, processing speed can be further increased, thereby making it more advantageous. For example, if a "+" shaped four-electrode deflector is arranged at the same orientation in each column as four electrodes, the same voltage is applied to the deflector electrode at the same orientation at the same time and then a particle beam is scanned, beams that are scanned by respective columns are not scanned at the same time but are alternately scanned onto a sample as described below, thereby enabling the beams to be easily detected in a sample current manner.

The principle of the present invention will be described in greater detail with reference to the accompanying drawings.

Figure 2:
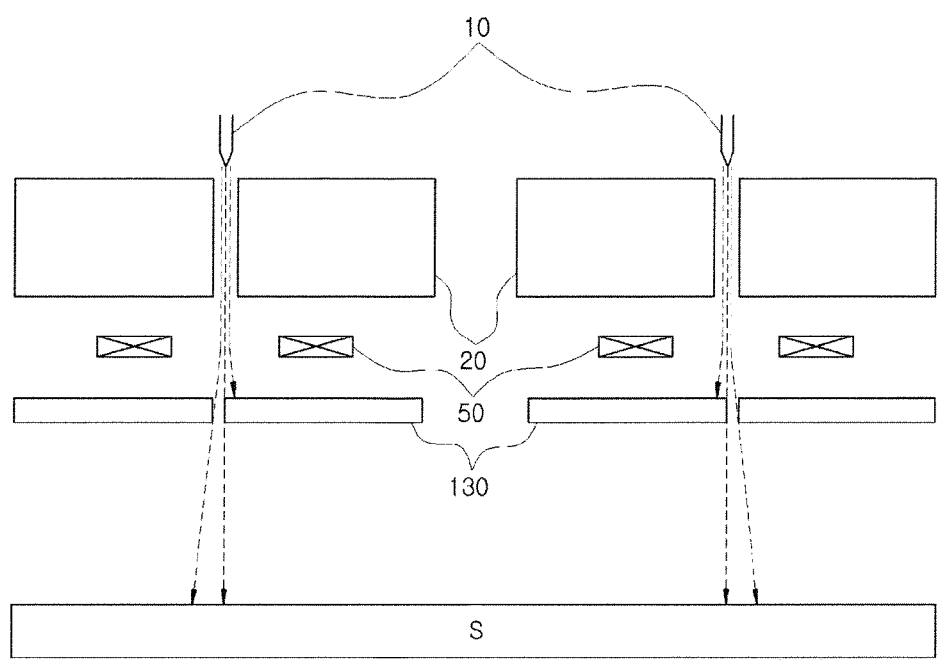
FIG. 2 is a sectional view illustrating an example of the use of an eccentric electrode layer in accordance with the present invention.

As shown in FIG. 2, electrons that are emitted by electron emission sources 10 each of which makes an electron beam, which is a representative example of a particle beam, are indicated by arrows. The electrons pass through electron lenses 20 illustrated as big rectangular boxes, and are scanned by deflectors 50. Because of an eccentric electrode layer 130 located below the deflectors 50 and configured to be eccentric from the optical axes of the beams, the overall beam is not scanned normally onto a sample S, but part thereof is scanned onto the sample s. Although two right and left electronic columns scan electron beams onto the same sample s, the eccentric electrode layer 130 having one or more apertures that are differently eccentric from the optical axes is used. As shown in the drawing, the apertures of the eccentric electrode layer 130 are eccentric from the normal optical axes in opposite outward directions.

Accordingly, if electron beams synchronized in the same direction are deflected in the same detector structure, only deflected parts are scanned onto the sample s, with the result that an actually scanned area is reduced, but electron beams scanned by two columns at the same time are not scanned onto the same sample at the same time. That is, as shown in FIG. 2, in the left column, the part of a corresponding beam on the left side of its optical axis is scanned normally, but the part of the beam on the right side thereof is not scanned. In contrast, in the right column, the part of a corresponding beam on the right side of its optical axis is scanned normally, but the part of the beam on the left side thereof is not scanned. Accordingly, the two columns do not scan the beams onto the same sample at the same time.

Figure 3:
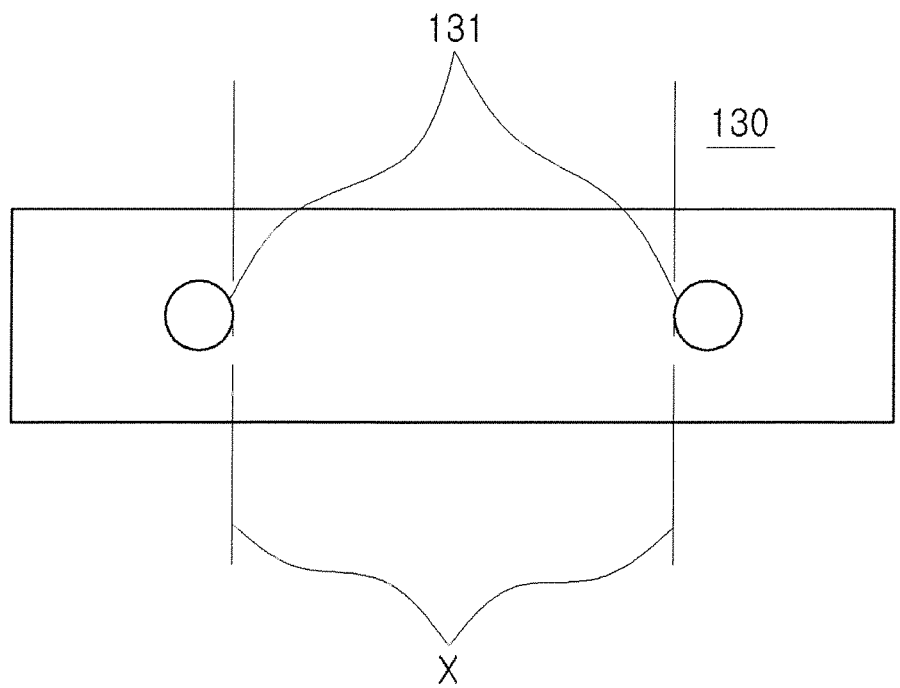
FIG. 3 is a plan view illustrating an example of the eccentric electrode layer in accordance with the present invention.
Figure 4:
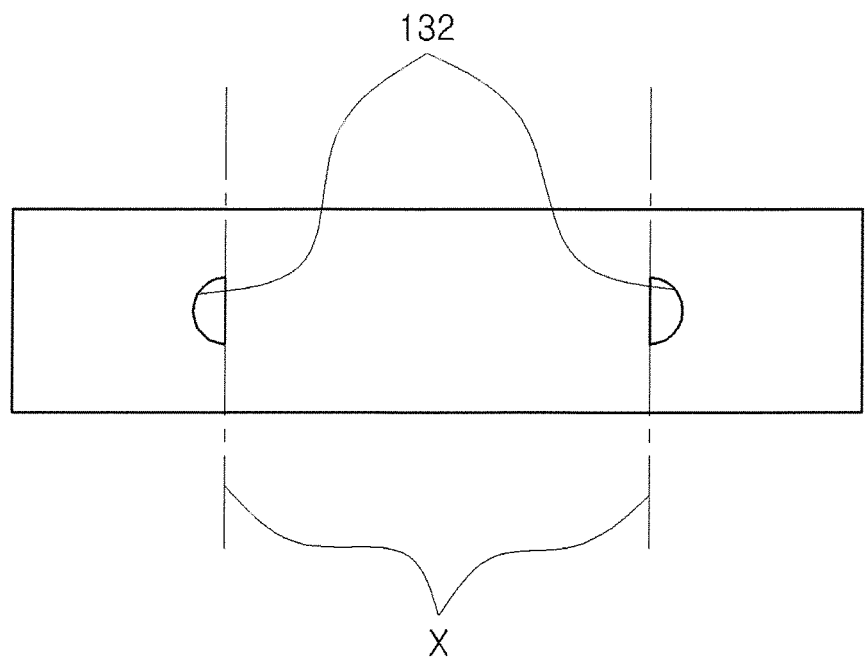
FIG. 4 is a plan view illustrating another example of the eccentric electrode layer in accordance with the present invention.
Figure 5:
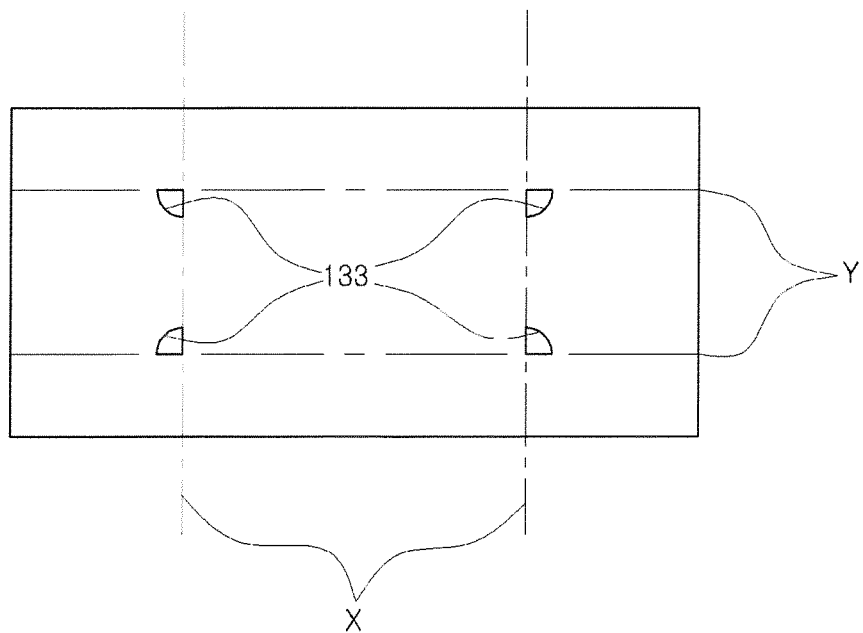
FIG. 5 is a plan view illustrating still another example of the eccentric electrode layer in accordance with the present invention.

FIGS. 3 to 5 illustrate more specific examples of the eccentric electrode layers 130 shown in FIG. 2.

FIGS. 3 and 4 illustrate eccentric electrode layers 130 each of which can be used in two columns.

Referring to FIG. 3, two apertures 131 are formed to be positioned away from corresponding optical axes X in opposite outward directions and are shaped in a circular form, as shown in FIG. 2. Referring to FIG. 4, two apertures 132 are formed so that the centers thereof are positioned away from corresponding optical axes X in opposite outward directions and are shaped in a semicircular form, as shown in FIG. 2. In order to prevent two beams from being scanned onto the same sample at the same time, the size of each circular aperture is reduced by half. If the size of the apertures 131 of the eccentric electrode layer 130 shown in FIG. 3 is equal to that of the original lens, as shown in FIG. 4, the overall size of the actual apertures may not be used to perform scanning. That is, not all of the eccentric portions are used, as shown in the example of FIG. 2. That is, the size may be determined based on the size of an actually scanned size.

In FIG. 5, in an eccentric electrode layer 130 that can be used for four columns, four quarter circles are arranged based on optical axes X and Y without overlapping each other. When four columns are used, it is preferred that the overall size of actually used apertures be equal to or smaller than that of existing apertures, so as to avoid overlapping. This does not mean the size of the actual circle as shown in the example of FIG. 3, but means the sum of areas that are scanned by actual beams.

If 8 columns are used, the size of each aperture will be further reduced. As described above, in the case of an n×m multicolumn, the size of each aperture will be reduced correspondingly.

Although the apertures have been described in connection with a circular shape, apertures in various shapes, such as a polygonal shape, may be employed, in which case the size of the apertures may be determined based on optical axes so that the apertures are eccentric, with the result that beams are prevented from overlapping, as described above. Furthermore, the eccentric directions may be determined so that beams are prevented from overlapping, as desired.

Furthermore, although the eccentric electrode layer 130 has been described as a single layer with a plurality of apertures, respective electrode layers may be arranged and used so that they can be disposed in the respective eccentric positions of a plurality of single columns when the plurality of single columns is arranged and used. That is, each of the eccentric electrode layers 130 of FIG. 3 to 5 may be divided into electrode layer sections for respective single columns, and then the resulting electrode layer sections may be used in the respective single columns. Meanwhile, when separate single columns are used, it is difficult to appropriately position eccentric electrode layer sections in the corresponding single columns rather than to appropriate position the eccentric electrode layer 130. Therefore, in order to prevent beams scanned onto a sample from overlapping, it is preferred that the size of all the effective apertures of the single columns be smaller than that of existing apertures.

Figure 1:
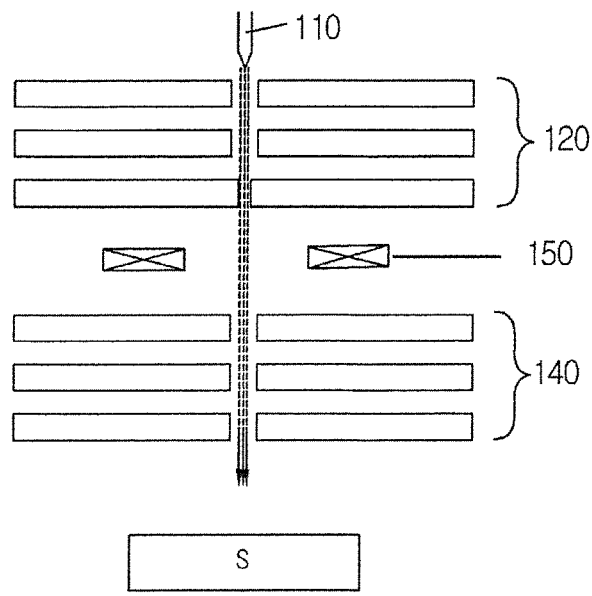
FIG. 1 is a diagram showing the structure of a microcolumn.

Two or more eccentric electrode layers in a multi-particle beam column may function as an electro-static lens or a part of the electron lens, such as an ordinary electrostatic lens. Referring to FIG. 1, it is possible for three eccentric electrode layers 130 of the present invention to constitute the Einzel lens 140 as a focus lens. Alternatively it is possible to one or two eccentric electrode layers 130 of the present invention to constitute a part of the Einzel lens 140 as a focus lens.

It is preferred that the eccentric electrode layer is positioned as the last electrode layer on paths along which beams propagate, since the overlapping of beams scanned by the multi-particle beam column on the same sample at the same time is certainly prevented.

When the multi-particle beam column having an eccentric electrode layer in accordance with the present invention is used, the deflectors arranged in the multi-particle beam column can be easily controlled using a single controller.

Furthermore, when a multi-particle beam is scanned onto a sample while the sample is being moved through a stage, throughput can be improved when a sample is enlarged and observed using a microscope or inspected.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A multi-particle beam column, having two or more particle beam columns, each particle beam column comprising a particle beam emission source, a deflector, and two or more electrode layers,
    wherein the multi-particle beam column comprises at least one electrode layer having two or more apertures that are eccentric from respective beam optical axes of each particle beam column (hereinafter referred to as the "eccentric electrode layer"),
    wherein the respective apertures of the eccentric electrode layer are positioned in an eccentric direction offset from the respective beam optical axes of the multi-particle beam column to avoid overlapping the respective particle beam optical axes of each particle beam column,
    wherein the eccentric electrode layer is positioned below the deflector, and
    wherein the respective deflectors of the multi- particle beam column are configured to scan all the respective particle beams to the same direction simultaneously,
    whereby the respective particle beams of the multi-particle beam column are not simultaneously irradiated onto a sample.

2. The multi-particle beam column of claim 1, wherein the respective particle beam column comprises two or more eccentric electrode layers, so that the eccentric electrode layers constitute an electron lens.

3. The multi-particle beam column of claim 1, wherein the eccentric electrode layer is positioned as the last electrode layer on paths along which beams propagate.

4. The multi-particle beam column of claim 2, wherein the eccentric electrode layer is positioned as the last electrode layer on paths along which beams propagate.

* * * * *